(12) United States Patent
Kim

(10) Patent No.: US 9,324,962 B2
(45) Date of Patent: Apr. 26, 2016

(54) ORGANIC LUMINESCENCE DISPLAY AND METHOD OF MANUFACTURING THE SAME

(71) Applicant: SAMSUNG DISPLAY CO., LTD., Yongin, Gyeonggi-Do (KR)

(72) Inventor: Jun-Young Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 88 days.

(21) Appl. No.: 14/011,520

(22) Filed: Aug. 27, 2013

(65) Prior Publication Data

US 2014/0332763 A1    Nov. 13, 2014

(30) Foreign Application Priority Data

May 9, 2013    (KR) .................. 10-2013-0052610

(51) Int. Cl.
| | | |
|---|---|---|
| H01L 29/08 | (2006.01) | |
| H01L 35/24 | (2006.01) | |
| H01L 51/00 | (2006.01) | |
| H01L 51/50 | (2006.01) | |
| H01L 51/52 | (2006.01) | |
| H01L 27/32 | (2006.01) | |

(52) U.S. Cl.
CPC ........ *H01L 51/5012* (2013.01); *H01L 27/3246* (2013.01); *H01L 51/5228* (2013.01); *H01L 51/5262* (2013.01); *H01L 51/5268* (2013.01); *H01L 51/0013* (2013.01); *H01L 51/52* (2013.01)

(58) Field of Classification Search
CPC . H01L 51/5262; H01L 51/5268; H01L 51/52; H01L 51/5012
USPC .............. 257/40, E51.021, E51.022, E51.018
See application file for complete search history.

(56) References Cited

U.S. PATENT DOCUMENTS 6,221,563 B1 *   4/2001   Hryhorenko et al. ......... 430/315
7,095,172 B2 *   8/2006   Sakamoto et al. ............ 313/506

FOREIGN PATENT DOCUMENTS

| KR | 10-2005-0068860 | 7/2005 |
|---|---|---|
| KR | 10-2010-0011706 | 2/2010 |
| KR | 10-2011-0087830 | 8/2011 |
| KR | 10-2012-0042144 | 5/2012 |

* cited by examiner

*Primary Examiner* — Robert Huber
(74) *Attorney, Agent, or Firm* — Lewis Roca Rothgerber Christie LLP

(57) ABSTRACT

According to an aspect of the present invention, an organic luminescence display includes a substrate, a first electrode on the substrate, a pixel defining layer on the first electrode and partially exposing the first electrode, an auxiliary layer on the pixel defining layer, an organic layer on the first electrode and an edge of the auxiliary layer, and a second electrode on the organic layer.

14 Claims, 16 Drawing Sheets

FIG. 4
(a) 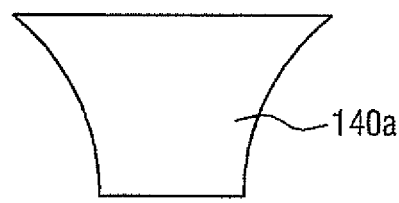
(b) 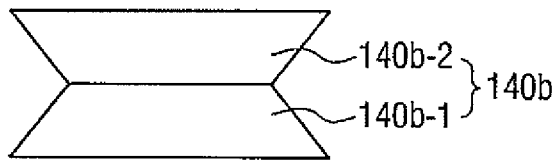
(c) 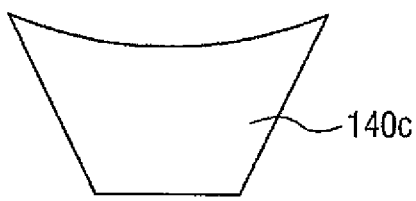

ORGANIC LUMINESCENCE DISPLAY AND METHOD OF MANUFACTURING THE SAME

CROSS-REFERENCE TO RELATED APPLICATION

This application claims priority to and the benefit of Korean Patent Application No. 10-2013-0052610, filed on May 9, 2013 in the Korean Intellectual Property Office, the entire content of which is incorporated herein by reference.

BACKGROUND

1. Field

Aspects of embodiments according to the present invention relate to an organic luminescence display and a method of manufacturing the same.

2. Description of the Related Art

An organic luminescence display is a display that can display information such as images, text, etc. by using light generated when holes and electrons supplied respectively from an anode and a cathode combine in an organic layer interposed between the anode and the cathode.

In order to form the organic layer, a comparable method of manufacturing an organic luminescence display uses processes, such as a printing process utilizing inkjet printing, spin coating, nozzle deposition, etc.; a process of depositing and then patterning a layer; or a transfer process utilizing heat or laser beams. Among these processes, a laser induced thermal imaging (LITI) process is capable of finely patterning an organic layer and is easy to perform.

In the LITI process, light emitted from a light source is absorbed by a light-to-heat conversion layer of a donor substrate and is converted into thermal energy. The thermal energy causes a portion of a transfer layer to be transferred onto an element substrate and thus forms an organic layer.

However, when a portion of the transfer layer is separated from the donor substrate, an edge of the separated portion of the transfer layer may not be even due to cohesion characteristics between organic materials within the transfer layer. That is, the edge of the separated portion of the transfer layer may include a random uneven surface. Therefore, if the separated portion of the transfer layer lands on the element substrate to form an organic layer, the organic layer may also include a random uneven surface.

The organic layer including the random uneven surface may not only reduce the overall flatness of the organic luminescence display but may also cause the formation of particles. In addition, if a thin-film encapsulation layer formed on the random uneven surface has cracks, oxygen, moisture, etc. may be introduced through the cracks, resulting in the formation of dark spots.

SUMMARY

Aspects of embodiments according to the present invention are directed toward an organic luminescence display in which a portion of an organic layer which includes a random uneven surface is separated from the other portion of the organic layer by an auxiliary layer.

Aspects of embodiments according to the present invention also are directed toward a method of manufacturing an organic luminescence display, in which a portion of an organic layer which includes a random uneven surface is separated from the other portion of the organic layer using an auxiliary layer.

However, aspects of embodiments according to the present invention are not restricted to the ones set forth herein. The above and other aspects of the present invention will become more apparent to one of ordinary skill in the art to which the present invention pertains by referencing the detailed description of embodiments of the present invention given below.

According to an embodiment of the present invention, an organic luminescence display includes: a substrate, a first electrode on the substrate, a pixel defining layer on the first electrode and partially exposing the first electrode, an auxiliary layer on the pixel defining layer, an organic layer on the first electrode and an edge of the auxiliary layer, and a second electrode on the organic layer.

According to another embodiment of the present invention, an organic luminescence display includes a plurality of pixels, each including a first electrode, a second electrode on the first electrode, and a middle portion of an organic layer between the first electrode and the second electrode, and at least one auxiliary layer between the pixels and having an edge portion of the organic layer on a surface thereof.

According to still another embodiment of the present invention, a method of manufacturing an organic luminescence display includes providing an element substrate which includes a substrate, a first electrode on the substrate, a pixel defining layer on the first electrode and partially exposing the first electrode, and an auxiliary layer on the pixel defining layer; placing a donor substrate, which includes a base layer, a light-to-heat conversion layer on the base layer, and a transfer layer on the light-to-heat conversion layer, over the element substrate such that the transfer layer faces the first electrode of the element substrate; and forming an organic layer by transferring the transfer layer onto the first electrode and an edge of the auxiliary layer of the element substrate by irradiating laser beams to the donor substrate from above the donor substrate.

BRIEF DESCRIPTION OF THE DRAWINGS

The above and other aspects and features of the present invention will become more apparent by describing in more detail example embodiments thereof with reference to the attached drawings, in which:

FIG. 4 is a cross-sectional view illustrating other shapes of the auxiliary layer;

DETAILED DESCRIPTION

Figure 1:
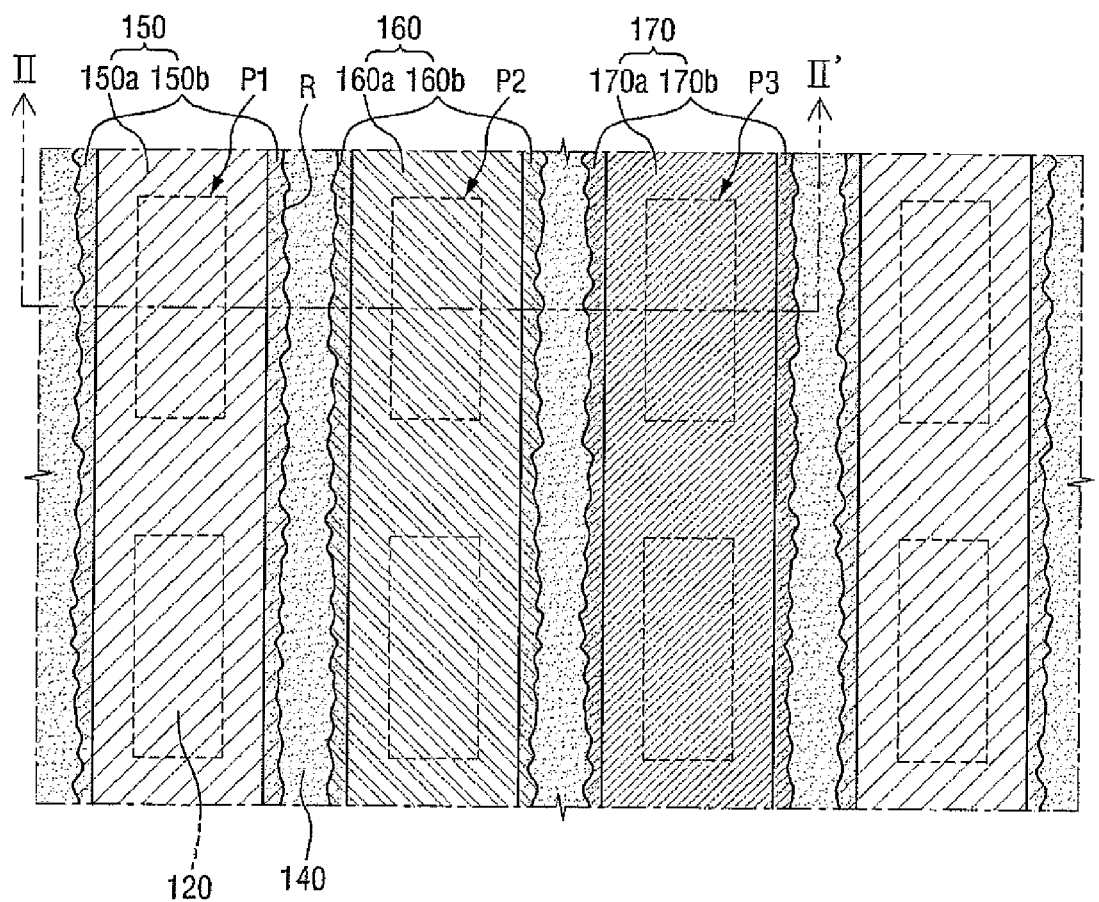
FIG. 1 is a schematic plan view of an organic luminescence display according to an embodiment of the present invention.

Aspects and features of the present invention and methods of accomplishing the same may be understood more readily by reference to the following detailed description of some embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will be defined by the appended claims and equivalents thereof. Thus, in some embodiments, known structures and devices are not shown in order not to obscure the description of the invention with unnecessary detail. Like numbers refer to like elements throughout. In the drawings, the thickness of layers and regions are exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. As used herein, the term "and/or" includes any and all combinations of one or more of the associated listed items. Further, the use of "may" when describing embodiments of the present invention refers to "one or more embodiments of the present invention."

Spatially relative terms, such as "below," "beneath," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Embodiments described herein will be described referring to plan views and/or cross-sectional views by way of ideal schematic views of the invention. Accordingly, the example views may be modified depending on manufacturing technologies and/or tolerances. Therefore, the embodiments of the invention are not limited to those shown in the views, but include modifications in configuration formed on the basis of manufacturing processes. Therefore, regions shown in the figures are for schematic illustrations only, and shapes of regions shown in the figures represent specific shapes of regions of elements only and do not limit aspects (scopes) of the invention.

Hereinafter, embodiments of the present invention will be described with reference to the attached drawings.

Figure 2:
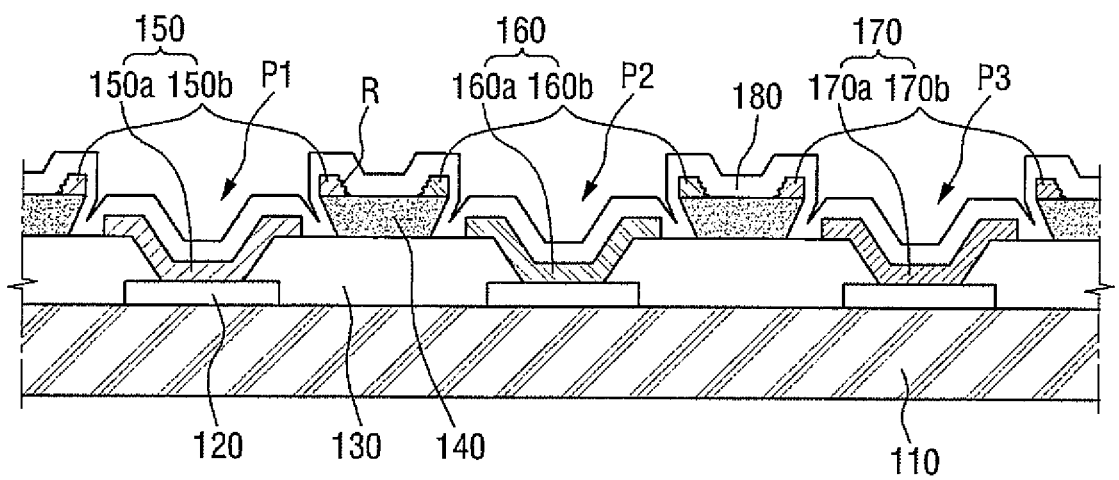
FIG. 2 is a cross-sectional view taken along the line II-II' of FIG. 1.
Figure 3:
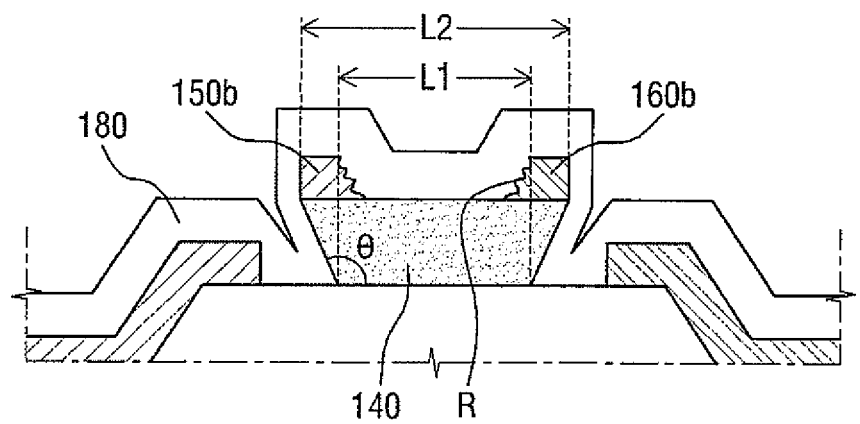
FIG. 3 is an enlarged cross-sectional view of an auxiliary layer of FIG. 2 and its surrounding area.

FIG. 1 is a schematic plan view of an organic luminescence display 100 according to an embodiment of the present invention. FIG. 2 is a cross-sectional view taken along the line II-II' of FIG. 1. FIG. 3 is an enlarged cross-sectional view of an auxiliary layer 140 of FIG. 2 and its surrounding area. FIG. 4 is a cross-sectional view illustrating other shapes of the auxiliary layer 140.

Referring to FIGS. 1 through 4, the organic luminescence display 100 according to the current embodiment may include a substrate 110, a plurality of first electrodes 120, a pixel defining layer 130, the auxiliary layer 140, an organic layer (150, 160, 170), and a second electrode 180. In addition, the organic luminescence display 100 according to the current embodiment may include a plurality of pixels (P1, P2, P3).

The substrate 110 may be a unit display substrate or a mother substrate before being cut into a plurality of unit display substrates. The substrate 110 may be a single substrate or may include a stack of a plurality of substrates.

The substrate 110 may be an insulating substrate. The insulating substrate may be formed of a transparent glass material containing transparent $SiO_2$ as its main component. In some embodiments, the insulating substrate may be formed of an opaque material or a plastic material. Further, the insulating substrate may be a flexible substrate that can be bent, folded or rolled.

Although not shown in the drawings, the substrate 110 may further include other structures formed on the insulating substrate. Examples of the structures may include wirings, electrodes, and insulating layers. If the organic luminescence display 100 according to the current embodiment is an active-matrix organic luminescence display, the substrate 110 may include a plurality of thin-film transistors (TFTs) formed on the insulating substrate. Each of the TFTs may include a gate electrode, a source electrode, and a drain electrode, and a semiconductor layer which is a channel region. The semiconductor layer may be formed of amorphous silicon, polycrystalline silicon, or monocrystalline silicon. In an alternative embodiment, the semiconductor layer may be formed of oxide semiconductor. The drain electrodes of at least some of the TFTs may be electrically connected to the first electrodes 120.

The first electrodes 120 may be disposed on the substrate 110. The first electrodes 120 may be separated from each other. The first electrodes 120 may be anodes or cathodes. If the first electrodes 120 are anodes, the second electrode 180 may be a cathode. Embodiments of the present invention will be described below according to this structure. However, the first electrodes 120 may also be cathodes, and the second electrode 180 may also be an anode.

To be used as anodes, the first electrodes 120 may be formed of a conductive material with a high work function. If the organic luminescence display 100 is of a bottom emission type, the first electrodes 120 may be formed of a material such as indium tin oxide (ITO), indium zinc oxide (IZO), zinc oxide (ZnO), $In_2O_3$, or may be formed of a stacked layer of these materials. If the organic luminescence display 100 is of a top emission type, the first electrodes 120 may further include a reflective layer formed of Ag, Mg, Al, Pt, Pd, Au, Ni, Nd, Ir, Cr, Li or Ca. The first electrodes 120 can be modified in various ways to have, for example, a structure composed of two or more layers formed using two or more different materials selected from the above materials.

The pixel defining layer 130 may be formed on the first electrodes 120. The pixel defining layer 130 may partially expose each of the first electrodes 120. The pixel defining layer 130 may be formed of at least one organic material selected from benzocyclobutene (BCB), polyimide (PI), polyamaide (PA), acrylic resin and phenolic resin; or an inorganic material such as silicon nitride. The pixel defining layer 130 may also be formed of a photosensitizer that contains a black pigment. In this case, the pixel defining layer 130 may serve as a light blocking member.

The auxiliary layer 140 may be disposed on the pixel defining layer 130. In an example embodiment, the auxiliary layer 140 may be formed on a flat top surface of the pixel defining layer 130. In addition, the auxiliary layer 140 may be formed between two adjacent first electrodes 120. The auxiliary layer 140 may not overlap the first electrodes 120 exposed by the pixel defining layer 130.

The auxiliary layer 140 may have various shapes. In addition, the auxiliary layer 140 may have a sharp edge. In an example embodiment, the auxiliary layer 140 may have an inversely tapered shape. Specifically, referring to FIG. 3, an angle θ formed by a side surface of the auxiliary layer 140 and the top surface of the pixel defining layer 130 may be 90 to 180 degrees. In addition, a width L2 of an upper side of the auxiliary layer 140 may be greater than a width L1 of a lower side thereof. Also, if the auxiliary layer 140 is cut along a surface parallel to a surface of the substrate 110, the area of the cut surface of the auxiliary layer 140 may be reduced as the distance to the substrate 110 decreases. In another example embodiment, referring to (a) of FIG. 4, an auxiliary layer 140a may have curved side surfaces. In another example embodiment, referring to (b) of FIG. 4, an auxiliary layer 140b may include a plurality of layers. For example, the auxiliary layer 140b may include a first auxiliary layer 140b-1 and a second auxiliary layer 140b-2 disposed on the first auxiliary layer 140b-1. Here, the first auxiliary layer 140b-1 may be tapered, and the second auxiliary layer 140b-2 may be inversely tapered. In addition, the first auxiliary layer 140b-1 may be formed of a positive photoresist, and the second auxiliary layer 140b-2 may be formed of a negative photoresist. In another example embodiment, referring to (c) of FIG. 4, an auxiliary layer may have a curved top surface. Specifically, the top surface of the auxiliary layer 140c may include a concave portion.

The auxiliary layer 140 may be formed of an organic material or an inorganic material. In an example embodiment, the auxiliary layer 140 may be formed of at least one organic material selected from benzocyclobutene, polyimide, polyamaide, acryl resin and phenolic resin. In another example embodiment, the auxiliary layer 140 may be formed of at least one inorganic material selected from silicon nitride and silicon oxide. In another example embodiment, the auxiliary layer 140 may be formed of the same material as the pixel defining layer 130. In another example embodiment, the auxiliary layer 140 may be formed of the same material as the second electrode 180.

The auxiliary layer 140 may be formed of an insulator or a conductor. In an example embodiment, the auxiliary layer 140 may be formed of acrylic-based resin, polyimide-based resin, novolac-based resin, etc. In another example embodiment, the auxiliary layer 140 may be formed of a molybdenum material, a tungsten material, an aluminum material, a titanium material, a chrome material, a silver material, any of these materials added with additives, or an alloy of any of these materials.

The auxiliary layer 140 may be formed using various methods. In an example embodiment, the auxiliary layer 140 may be formed by a photolithography process using, e.g., photoresist. Specifically, after a photoresist reactive to light is coated on the whole surface, it is exposed to light through a mask and is then developed to produce the auxiliary layer 140 which is a photoresist pattern. The above-described shapes of the auxiliary layer 140 can be realized by adjusting light used in the exposure process, the type of the photoresist, etc.

The organic layer (150, 160, 170) may be disposed on each of the first electrodes 120 and the auxiliary layer 140. The organic layer (150, 160, 170) may include organic material layers included in the organic luminescence display 100, that is, an organic light-emitting layer (EML), a hole injection layer (HIL), a hole transport layer (HTL), an electron injection layer (EIL), an electron transport layer (ETL), etc. The organic layer (150, 160, 170) may have a single layer structure including one layer selected from the above organic material layers or a multilayer structure including two or more layers selected from the above organic material layers.

The organic layer (150, 160, 170) may include a middle portion (150a, 160a, 170a) and an edge portion (150b, 160b, 170b).

The middle portion (150a, 160a, 170a) of the organic layer (150, 160, 170) may be disposed on each of the first electrodes 120. In an example embodiment, the middle portion (150a, 160a, 170a) of the organic layer (150, 160, 170) may contact each of the first electrodes 120 and the pixel defining layer 130 adjacent to each of the first electrodes 120. In addition, the middle portion (150a, 160a, 170a) of the organic layer (150, 160, 170) may not contact the auxiliary layer 140.

Holes and electrons generated by each of the first electrodes 120 and the second electrode 180 may combine in the middle portion (150a, 160a, 170a) of the organic layer (150, 160, 170). When an energy level of excitons formed by the combination of the holes and the electrons in the middle portion (150a, 160a, 170a) of the organic layer (150, 160, 170) changes from an excited state to a ground state, light of a color corresponding to the changed energy level may be emitted.

The edge portion (150b, 160b, 170b) of the organic layer (150, 160, 170) may be disposed on the auxiliary layer 140. In an example embodiment, the edge portion (150b, 160b, 170b) of the organic layer (150, 160, 170) may contact an edge of a top surface of the auxiliary layer 140. In addition, the edge portion (150b, 160b, 170b) of the organic layer (150, 160, 170) may not contact the first electrodes 120 and the pixel defining layer 130. The edge portion (150b, 160b, 170b) of the organic layer (150, 160, 170) may expose a middle portion of the top surface of the auxiliary layer 140.

The edge portion (150b, 160b, 170b) of the organic layer (150, 160, 170) may include a random uneven surface R. The random uneven surface R may face the middle portion of the top surface of the auxiliary layer 140. Surface roughness of the random uneven surface R of the edge portion (150b, 160b, 170b) of the organic layer (150, 160, 170) may be higher than those of other surfaces of the edge portion (150b, 160b, 170b). That is, other surfaces of the edge portion (150b, 160b, 170b) of the organic layer (150, 160, 170) may be smooth compared with the random uneven surface R of the edge portion (150b, 160b, 170b) of the organic layer (150, 160, 170).

Holes and electrons generated by each of the first electrodes 120 and the second electrode 180 cannot combine in the edge portion (150*b*, 160*b*, 170*b*) of the organic layer (150, 160, 170). That is, because the edge portion (150*b*, 160*b*, 170*b*) of the organic layer (150, 160, 170) is not in contact with the first electrodes 120, electrons cannot be injected into the edge portion (150*b*, 160*b*, 170*b*) of the organic layer (150, 160, 170). Therefore, light of a certain color cannot be emitted from the edge portion (150*b*, 160*b*, 170*b*) of the organic layer (150, 160, 170). That is, the edge portion (150*b*, 160*b*, 170*b*) of the organic layer (150, 160, 170) may be a dummy pattern.

The middle portion (150*a*, 160*a*, 170*a*) of the organic layer (150, 160, 170) and the edge portion (150*b*, 160*b*, 170*b*) of the organic layer (150, 160, 170) may be formed of the same material. That is, the middle portion (150*a*, 160*a*, 170*a*) of the organic layer (150, 160, 170) and the edge portion (150*b*, 160*b*, 170*b*) of the organic layer (150, 160, 170) may be formed from the same transfer layer (230, 330, 430 in FIGS. 7 through 12). The middle portion (150*a*, 160*a*, 170*a*) of the organic layer (150, 160, 170) may be separated from the edge portion (150*b*, 160*b*, 170*b*) of the organic layer (150, 160, 170). In an example embodiment, a side surface of the middle portion (150*a*, 160*a*, 170*a*) of the organic layer (150, 160, 170) may lie in the same plane with a side surface of the edge portion (150*b*, 160*b*, 170*b*) of the organic layer (150, 160, 170) which corresponds to an edge of the adjacent auxiliary layer 140.

The organic layer (150, 160, 170) may be provided as a plurality of organic layers. The organic layers (150, 160, 170) may include a first organic layer 150, a second organic layer 160 and a third organic layer 170. The organic layers (150, 160, 170) may be formed of different materials. However, the present invention is not limited thereto, and at least two of the first organic layer 150, the second organic layer 160 and the third organic layer 170 may be formed of the same material. In addition, the first organic layer 150, the second organic layer 160, and the third organic layer 170 may have the same stacked structure. However, the present invention is not limited thereto, and at least one of the first organic layer 150, the second organic layer 160 and the third organic layer 170 may have a different stacked structure.

In an example embodiment, the first organic layer 150, the second organic layer 160, and the third organic layer 170 may emit light of different colors. However, the present invention is not limited thereto, and at least two of the first organic layer 150, the second organic layer 160, and the third organic layer 170 may emit light of the same color. In the example embodiment of FIGS. 1 and 2, the first organic layer 150 may emit red light, the second organic layer 160 may emit green light, and the third organic layer 170 may emit blue light.

The second electrode 180 may be formed on the organic layer (150, 160, 170). To be used as a cathode, the second electrode 180 may be formed of a conductive material with a low work function. In an example embodiment, the second electrode 180 may be formed of Ag, Mg, Al, Pt, Pd, Au, Ni, Nd, Ir, Cr, Li or Ca.

The second electrode 180 may be a continuous layer on the substrate 110. That is, the second electrode 180 may completely cover structures located thereunder, such as the organic layer (150, 160, 170), the auxiliary layer 140, etc. For example, the second electrode 180 disposed on the middle portion (150*a*, 160*a*, 170*a*) of the organic layer (150, 160, 170) may be connected to the second electrode 180 disposed on the edge portion (150*b*, 160*b*, 170*b*) of the organic layer (150, 160, 170). In another example embodiment, the second electrode 180 may be discontinuous on some regions of the substrate 110. For example, the second electrode 180 disposed on the middle portion (150*a*, 160*a*, 170*a*) of the organic layer (150, 160, 170) may be separated from the second electrode 180 disposed on the edge portion (150*b*, 160*b*, 170*b*) of the organic layer (150, 160, 170).

The pixels (P1, P2, P3) may be located in regions exposed by the pixel defining layer 130. That is, the pixels (P1, P2, P3) may respectively be located in the opening regions of the pixel defining layer 130. That is, the pixels (P1, P2, P3) may be separated from each other by the pixel defining layer 130. Each of the pixels (P1, P2, P3) may include a first electrode 120, the second electrode 180 disposed on the first electrode 120, and the middle portion (150*a*, 160*a*, 170*a*) of the organic layer (150, 160, 170) which is interposed between the first electrode 120 and the second electrode 180.

The pixels (P1, P2, P3) may include a plurality of first pixels P1, a plurality of second pixels P2, and a plurality of third pixels P3.

Referring to FIG. 1, the pixels (P1, P2, P3), that is, the first pixels P1, the second pixels P2, and the third pixels P3 may be quadrangularly shaped, but are not limited thereto, and may also be in circular, ellipsoidal, or polygonal shape. In addition, at least one of the first pixel P1, the second pixel P2 and the third pixel P3 may have a different shape from that of the other pixels.

Referring to FIG. 2, each of the first pixels P1 may include a first middle portion 150*a* of the first organic layer 150, each of the second pixels P2 may include a second middle portion 160*a* of the second organic layer 160, and each of the third pixels P3 may include a third middle portion 170*a* of the third organic layer 170. In addition, each of the first pixels P1 may be adjacent to a first edge portion 150*b* of the first organic layer 150, each of the second pixels P2 may be adjacent to a second edge portion 160*b* of the second organic layer 160, and each of the third pixels P3 may be adjacent to a third edge portion 170*b* of the third organic layer 170.

The first middle portion 150*a* and the first edge portion 150*b* may be formed of the same material, the second middle portion 160*a* and the second edge portion 160*b* may be formed of the same material, and the third middle portion 170*a* and the third edge portion 170*b* may be formed of the same material. In addition, the first middle portion 150*a* and the first edge portion 150*b* may be formed from the same transfer layer 230 (see FIGS. 7 and 8), the second middle portion 160*a* and the second edge portion 160*b* may be formed from the same transfer layer 330 (see FIGS. 9 and 10), and the third middle portion 170*a* and the third edge portion 170*b* may be formed from the same transfer layer 430 (see FIGS. 11 and 12).

Although not shown in the drawings, each of the first through third pixels P1 through P3 may further include a power supply unit which applies an electric potential to a corresponding first electrode 120 and the second electrode 180.

The first through third pixels P1 through P3 may emit light of different colors. However, the present invention is not limited thereto, and at least two of the first through third pixels P1 through P3 may emit light of the same color. In an example embodiment, the first pixels P1 may emit red light, the second pixels P2 may emit green light, and the third pixels P3 may emit blue light.

The pixels (P1, P2, P3), that is, the first pixels P1, the second pixels P2, and the third pixels P3 may be arranged in a matrix pattern. An $n^{th}$ column of the pixels (P1, P2, P3) may include the first pixels P1, an $(n+1)^{th}$ column adjacent to the $n^{th}$ column may include the second pixels P2, and an $(n+2)^{th}$ column adjacent to the $(n+1)^{th}$ column may include the third pixels P3. The $n^{th}$ column, the $(n+1)^{th}$ column, and the $(n+2)^{th}$ column may be parallel to each other. The arrangement of the pixels (P1, P2, P3) may be a repetition of the $n^{th}$ column, the $(n+1)^{th}$ column, and the $(n+2)^{th}$ column in this order along a row direction. Here, n is a natural number, i.e., an integer greater than zero, and each of the pixels (P1, P2, P3) may be formed at an intersection of one row and one column.

Each of the first pixels P1 may be adjacent to the second and third pixels P2 and P3 along a row direction and may be adjacent to other first pixels P1 along a column direction. Each of the second pixels P2 may be adjacent to the first and third pixels P1 and P3 along the row direction and may be adjacent to other second pixels P2 along the column direction. Each of the third pixels P3 may be adjacent to the first and second pixels P1 and P2 along the row direction and may be adjacent to other third pixels P3 along the column direction.

The auxiliary layer 140 may be disposed parallel to rows or columns of the pixels (P1, P2, P3). In the example embodiment of FIG. 1, the auxiliary layer 140 may be disposed parallel to the columns of the pixels (P1, P2, P3). However, the present invention is not limited thereto, and the auxiliary layer 140 may also be disposed parallel to the rows of the pixels (P1, P2, P3). In addition, the auxiliary layer 140 may be formed in a middle portion of a region between two adjacent pixels. That is, the middle portion of the auxiliary layer 140 may overlap the middle portion of the region between two adjacent pixels. The auxiliary layer 140 may be formed as a continuous layer, but is not limited thereto, and may also be formed as a discontinuous layer. Also, a plurality of auxiliary layers 140 can be formed between two adjacent pixels.

At least two of the first edge portion 150b, the second edge portion 160b, and the third edge portion 170b may be disposed on the surface of the auxiliary layer 140. The edge portions (150b, 160b, 170b) of the organic layers (150, 160, 170) disposed on the surface of the auxiliary layer 140 may be substantially parallel to each other.

As described above, in the organic luminescence display 100 according to the current embodiment, a portion of the organic layer (150, 160, 170) which includes the random uneven surface R is separated from the rest of the organic layer (150, 160, 170) using the auxiliary layer 140. Specifically, the edge portion (150b, 160b, 170b) of the organic layer (150, 160, 170) which includes the random uneven surface R may be separated from each of the pixels (P1, P2, P3) and then placed on an edge of the auxiliary layer 140, thereby improving the flatness of the organic layer (150, 160, 170) included in each of the pixels (P1, P2, P3). The improved flatness of the organic layer (150, 160, 170) included in each of the pixels (P1, P2, P3) can enhance display quality of each of the pixels (P1, P2, P3). In addition, because the improved flatness of the organic layer (150, 160, 170) enhances the flatness of a thin-film encapsulation layer formed on the pixels (P1, P2, P3), it is possible to reduce or prevent the occurrence of defects, such as developing dark spots, in the pixels (P1, P2, P3). Furthermore, if the auxiliary layer 140 is formed of a conductor, it can serve as an auxiliary electrode. That is, the auxiliary layer 140 can reduce power consumption of the organic luminescence display 100 by reducing resistance of the second electrode 180.

Figure 5:
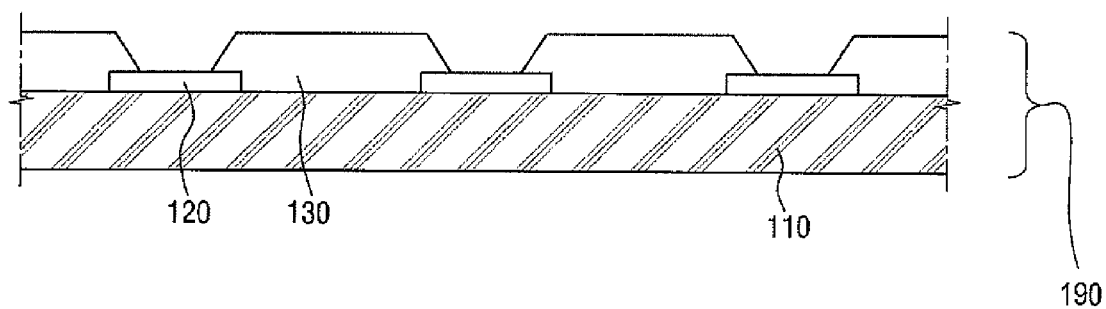
FIG. 5 is a cross-sectional view illustrating an operation of providing a stacked structure of a substrate, a plurality of first electrodes, and a pixel defining layer in a method of manufacturing an organic luminescence display according to an embodiment of the present invention.
Figure 6:
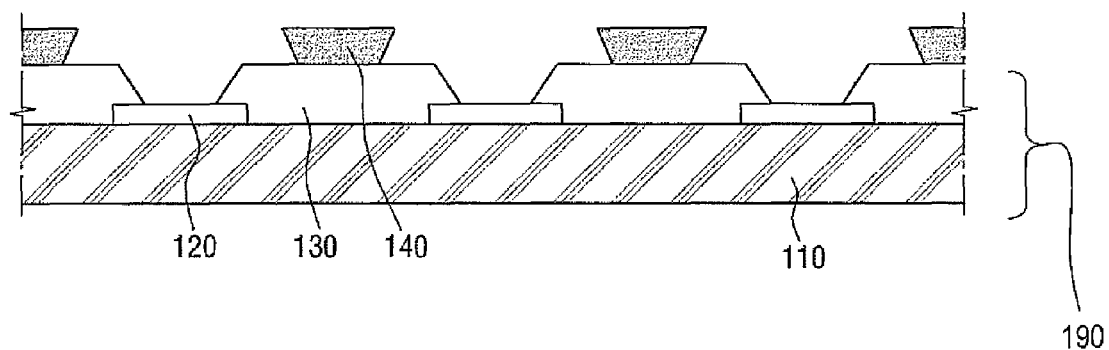
FIG. 6 is a cross-sectional view illustrating an operation of forming an auxiliary layer in the method of manufacturing the organic luminescence display according to the embodiment of the present invention.
Figure 7:
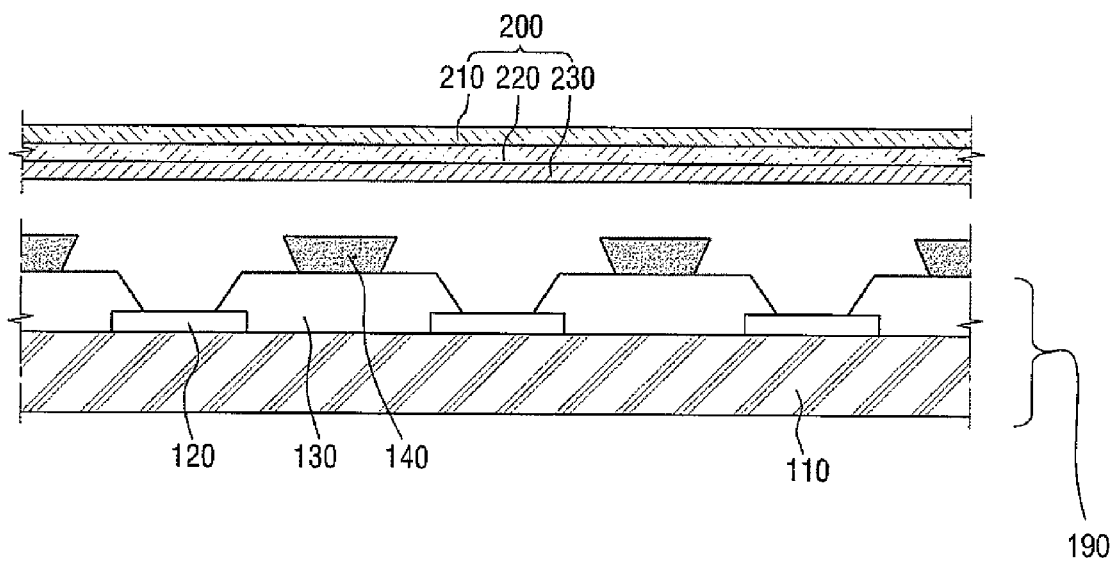
FIG. 7 is a cross-sectional view illustrating an operation of placing a first donor substrate over an element substrate in the method of manufacturing the organic luminescence display according to the embodiment of the present invention.
Figure 8:
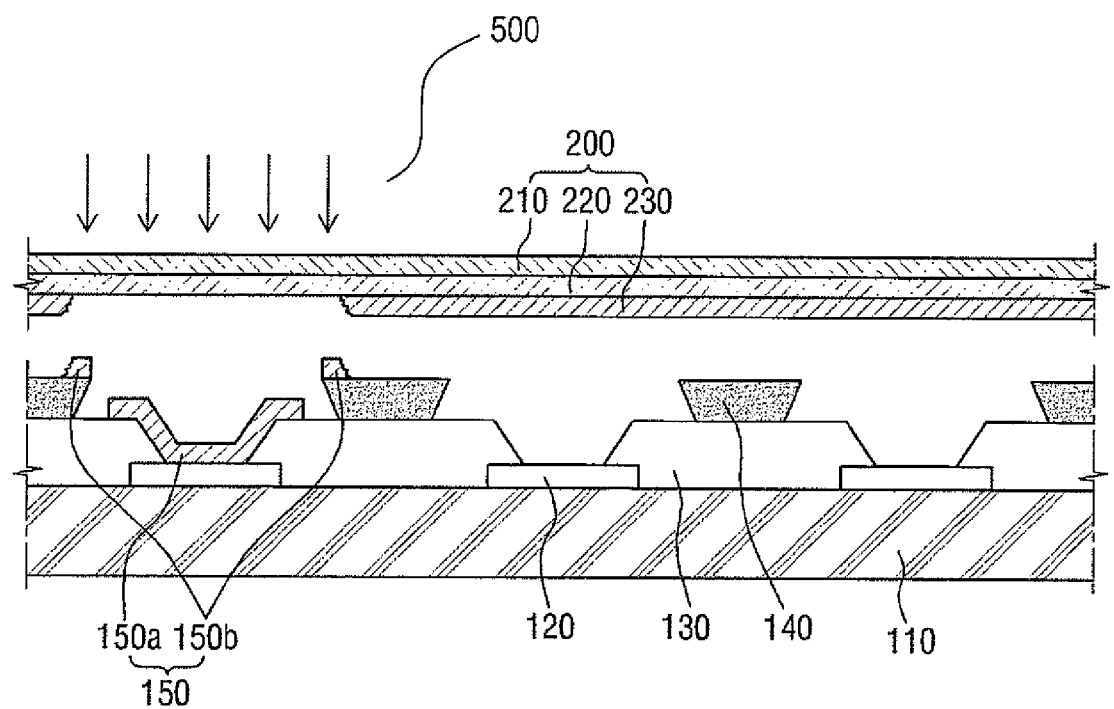
FIG. 8 is a cross-sectional view illustrating an operation of forming a first organic layer in the method of manufacturing the organic luminescence display according to the embodiment of the present invention.
Figure 9:
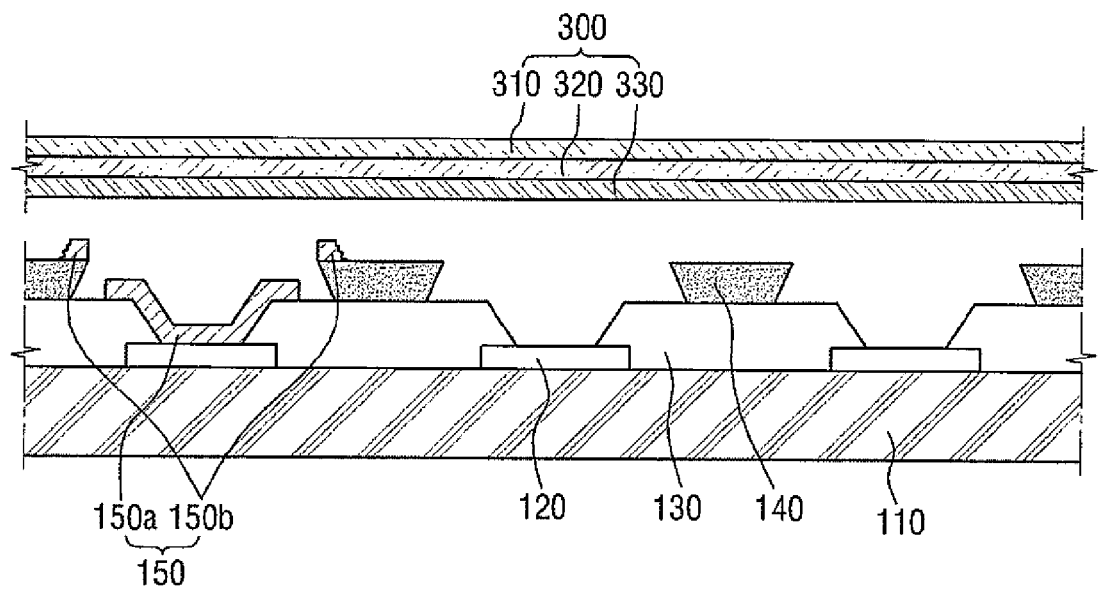
FIG. 9 is a cross-sectional view illustrating an operation of placing a second donor substrate over the element substrate in the method of manufacturing the organic luminescence display according to the embodiment of the present invention.
Figure 10:
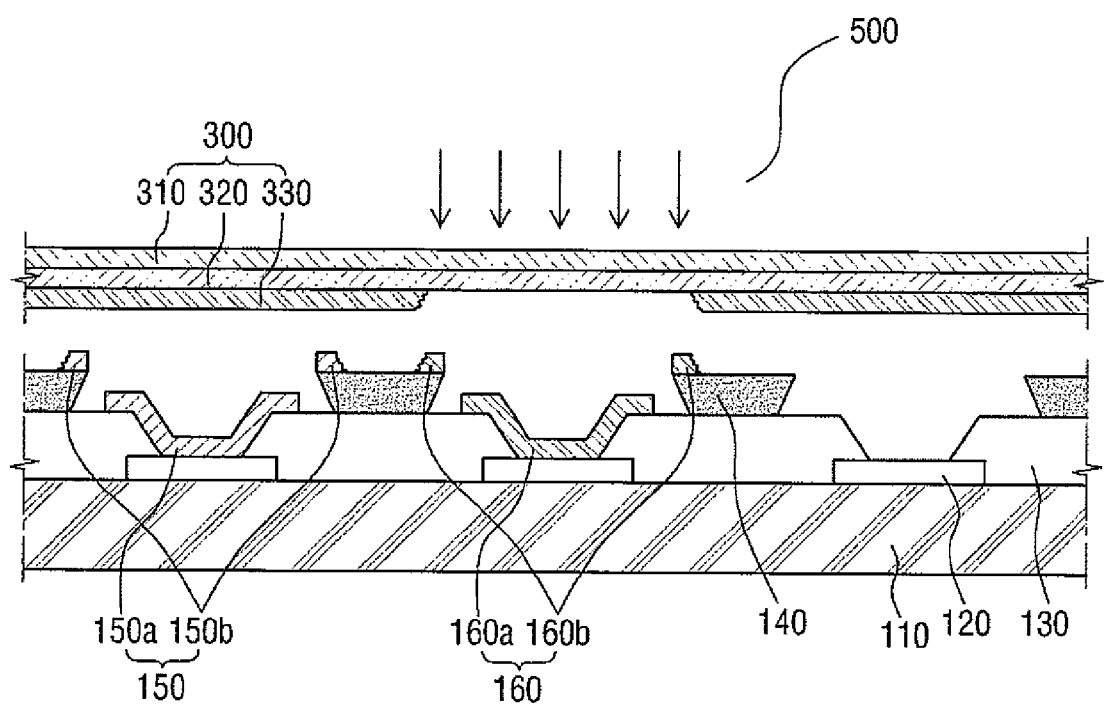
FIG. 10 is a cross-sectional view illustrating an operation of forming a second organic layer in the method of manufacturing the organic luminescence display according to the embodiment of the present invention.
Figure 11:
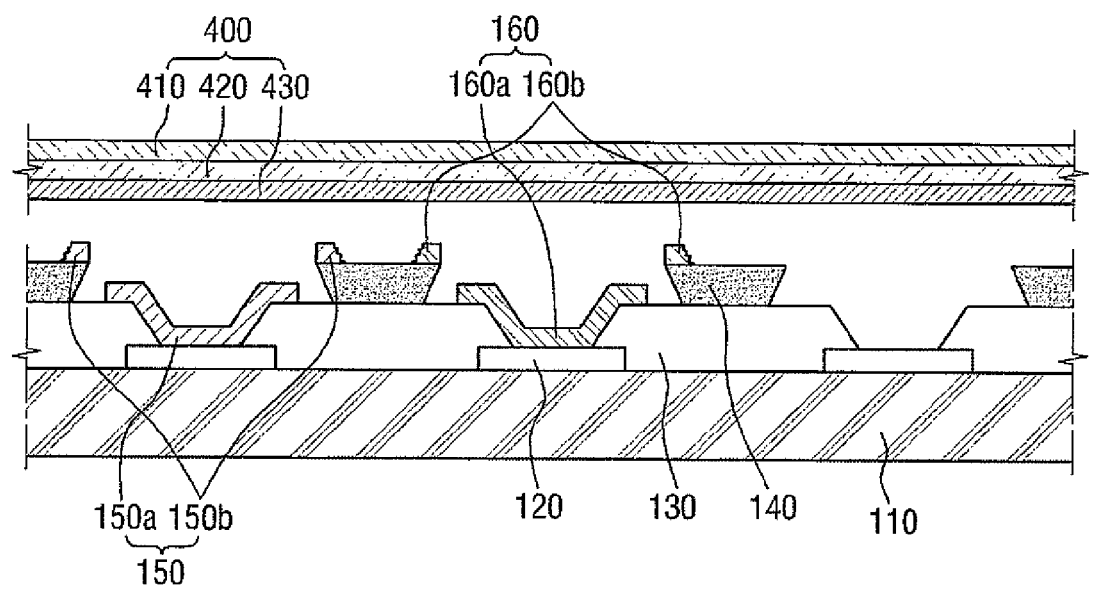
FIG. 11 is a cross-sectional view illustrating an operation of placing a third donor substrate over the element substrate in the method of manufacturing the organic luminescence display according to the embodiment of the present invention.
Figure 12:
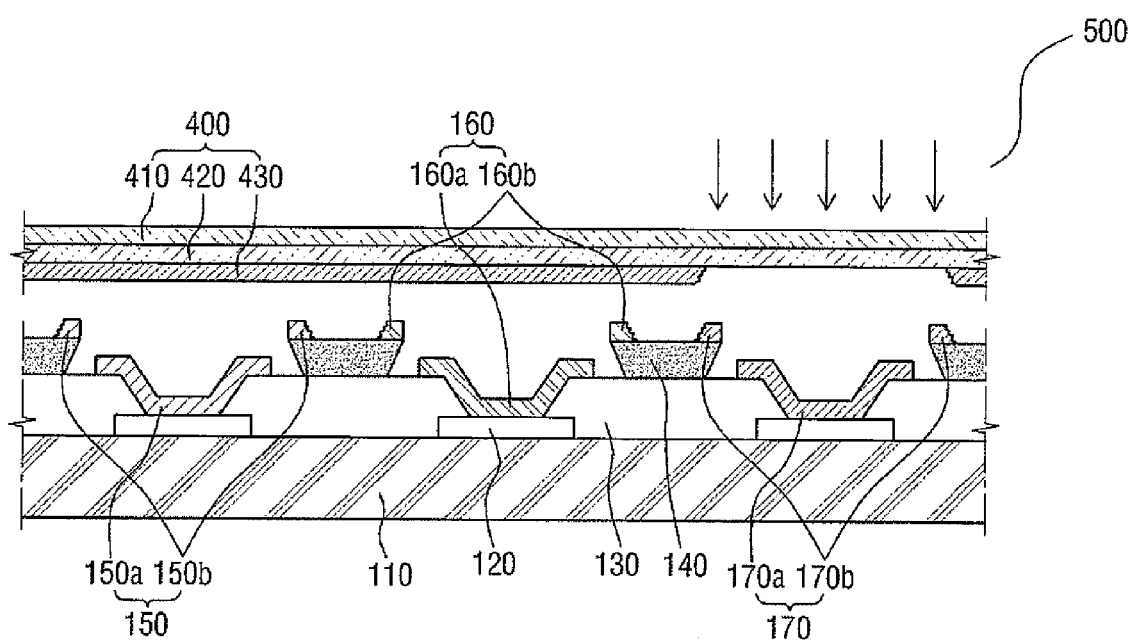
FIG. 12 is a cross-sectional view illustrating an operation of forming a third organic layer in the method of manufacturing the organic luminescence display according to the embodiment of the present invention.
Figure 13:
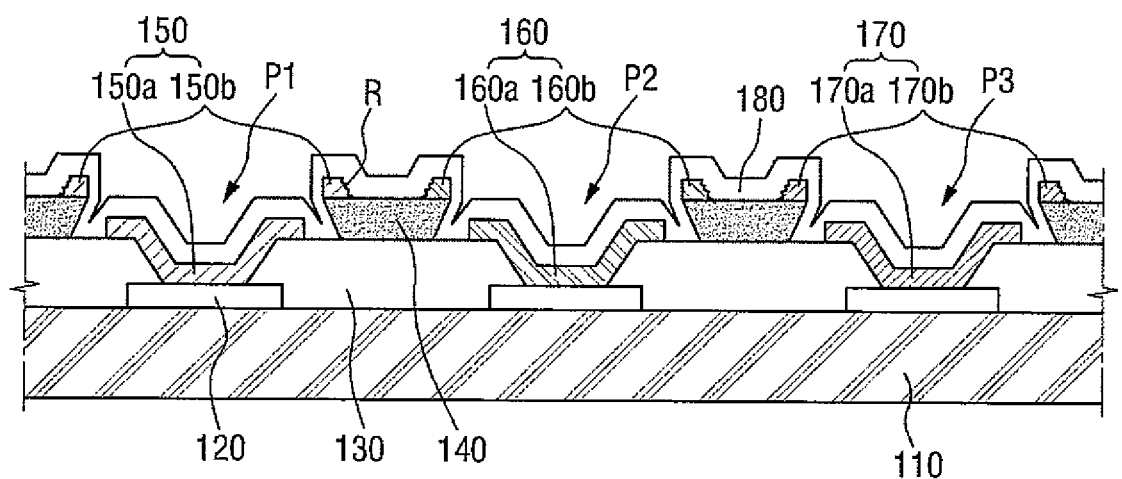
FIG. 13 is a cross-sectional view illustrating an operation of forming a second electrode in the method of manufacturing the organic luminescence display according to the embodiment of the present invention.

A method of manufacturing the organic luminescence display 100 according to an embodiment of the present invention will now be described with reference to FIGS. 5 through 13. FIG. 5 is a cross-sectional view illustrating an operation of providing a stacked structure of a substrate 110, a plurality of first electrodes 120, and a pixel defining layer 130 in a method of manufacturing an organic luminescence display 100 according to an embodiment of the present invention. FIG. 6 is a cross-sectional view illustrating an operation of forming an auxiliary layer 140 in the method of manufacturing the organic luminescence display 100 according to the embodiment of the present invention. FIG. 7 is a cross-sectional view illustrating an operation of placing a first donor substrate 200 over an element substrate 190 in the method of manufacturing the organic luminescence display 100 according to the embodiment of the present invention. FIG. 8 is a cross-sectional view illustrating an operation of forming a first organic layer 150 in the method of manufacturing the organic luminescence display 100 according to the embodiment of the present invention. FIG. 9 is a cross-sectional view illustrating an operation of placing a second donor substrate 300 over the element substrate 190 in the method of manufacturing the organic luminescence display 100 according to the embodiment of the present invention. FIG. 10 is a cross-sectional view illustrating an operation of forming a second organic layer 160 in the method of manufacturing the organic luminescence display 100 according to the embodiment of the present invention. FIG. 11 is a cross-sectional view illustrating an operation of placing a third donor substrate 400 over the element substrate 190 in the method of manufacturing the organic luminescence display 100 according to the embodiment of the present invention. FIG. 12 is a cross-sectional view illustrating an operation of forming a third organic layer 170 in the method of manufacturing the organic luminescence display 100 according to the embodiment of the present invention. FIG. 13 is a cross-sectional view illustrating an operation of forming a second electrode 180 in the method of manufacturing the organic luminescence display 100 according to the embodiment of the present invention. For simplicity, elements substantially identical to those of FIGS. 1 through 4 are indicated by like reference numerals, and thus a redundant description thereof will be omitted.

Referring to FIG. 5, the first electrodes 120 and the pixel defining layer 130 may be formed on a substrate 110. Specifically, after the preparation of the substrate 110, the first electrodes 120 separated from each other by a set or predetermined distance may be formed on the substrate 110, and the pixel defining layer 130 partially exposing each of the first electrodes 120 may be formed on the first electrodes 120.

Referring to FIG. 6, after the formation of the first electrodes 120 and the pixel defining layer 130 on the substrate 110, the auxiliary layer 140 may be formed on the pixel defining layer 130. In an example embodiment, the auxiliary layer 140 may be formed by a photolithography process using, e.g., photoresist. Specifically, a photoresist may be coated on the whole surface by spin coating and then prebaked. The coated photoresist may be exposed to light and developed using a mask and then cured with heat, thereby forming the auxiliary layer 140 which is a photoresist pattern. The shape of the auxiliary layer 140 can be adjusted by changing light used in the exposure process, the type of photoresist, etc. In addition, a negative photoresist may be used. The negative photoresist makes it easy to form an inversely tapered shape. For ease of description, the stacked structure of the substrate 110, the first electrodes 120, the pixel defining layer 130, and the auxiliary layer 140 will hereinafter be defined as the element substrate 190.

Referring to FIG. 7, after the formation of the auxiliary layer 140 on the pixel defining layer 130, the first donor substrate 200 may be placed over the element substrate 190. In the example embodiment of FIG. 7, the first donor substrate 200 may be separated from the element substrate 190 by a set or predetermined distance. However, the present invention is not limited thereto, and the first donor substrate 200 and the element substrate 190 may also be laminated.

The first donor substrate 200 may include a first base layer 210, a first light-to-heat conversion layer 220, and a first transfer layer 230.

The first base layer 210 may be formed of a transparent polymer. Examples of the transparent polymer include polyester (such as polyethylene terephthalate), polyacryl, polyepoxy, polyethylene, polystyrene, and the like. Among these examples, a polyethylene terephthalate film may be mainly used. The first base layer 210 may also be formed of glass. The first base layer 210 should have optical properties and mechanical stability suitable for a support film. The first base layer 210 may have a thickness of 10 to 500 μm.

The first base layer 210 may have a shape corresponding to that of the element substrate 190. In an example embodiment, the shape and area of a surface of the first base layer 210 may be the same as those of a surface of the element substrate 190. In another example embodiment, the first base layer 210 may be large enough to fully cover the element substrate 190.

The first light-to-heat conversion layer 220 may be disposed on the first base layer 210. The first light-to-heat conversion layer 220 absorbs light in an infrared-visible range and converts some of the light into heat. To this end, the first light-to-heat conversion layer 220 should have suitable optical density and includes a light absorbing material. The first light-to-heat conversion layer 220 may be a metal layer which contains aluminum oxide or aluminum sulfide as the light absorbing material or a polymer organic layer which contains carbon black, graphite or infrared dye as the light absorbing material. If the first light-to-heat conversion layer 220 is the metal layer, it may be formed to a thickness of 100 to 5,000 Å by vacuum deposition, electron beam deposition or sputtering. If the first light-to-heat conversion layer 220 is the polymer organic layer, it may be formed to a thickness of 0.1 to 10 μm by a typical film coating method such as roll coating, gravure coating, extrusion coating, spin coating, or knife coating.

Although not shown in the drawing, the first donor substrate 200 may include a first intermediate layer and a first buffer layer.

The first intermediate layer may be disposed between the first light-to-heat conversion layer 220 and the first transfer layer 230. The first intermediate layer may prevent the light absorbing material (e.g., carbon black) of the first light-to-heat conversion layer 220 from contaminating the first transfer layer 230 formed in a subsequent process. The first intermediate layer may be formed of acrylic resin or alkyd resin. The first intermediate layer may be formed by a typical coating process such as solvent coating and a curing process such as ultraviolet curing.

The first buffer layer may be disposed between the first light-to-heat conversion layer 220 and the first transfer layer 230 or, if the first intermediate layer is present, between the first intermediate layer and the first transfer layer 230. The first buffer layer may be formed to prevent damage to the organic layers formed in the first transfer layer 230 and effectively adjust adhesion between the first light-to-heat conversion layer 220 and the first transfer layer 230 or, if the first intermediate layer is present, between the first intermediate layer and the first transfer layer 230. The first buffer layer may contain at least one of an insulating material, a metal, and a metal oxide.

The first transfer layer 230 may be disposed on the first light-to-heat conversion layer 220. The first transfer layer 230 may be formed of substantially the same material as the first organic layer 150 and may have the same stacked structure as the first organic layer 150.

The first donor substrate 200 may be placed over the element substrate 190 such that the first transfer layer 230 faces the first electrodes 120 of the element substrate 190.

Referring to FIG. 8, after the first donor substrate 200 is placed over the element substrate 190, the first organic layer 150 may be formed by irradiating laser beams 500 (or a laser beam 500) to the first donor substrate 200. Specifically, a portion of the first transfer layer 230 which is located above a corresponding first electrode 120 and an edge of the auxiliary layer 140 may be separated from the first donor substrate 200 by irradiating the laser beams 500 to a region of the first donor substrate 200 which is located above the first electrode 120 and the edge of the auxiliary layer 140. Here, an edge of the separated portion of the first transfer layer 230 may not be even due to cohesion characteristics between organic materials within the first transfer layer 230. That is, the edge of the separated portion of the first transfer layer 230 may include a random uneven surface R. Therefore, to separate the random uneven surface R from the other part of the separated portion of the first transfer layer 230, the edge of the separated portion of the first transfer layer 230 may be made to correspond to the edge of the auxiliary layer 140 (such as the edge between the middle portion 150a and the edge portion 150b of the organic layer being aligned with the edge of the auxiliary layer 140). Because the edge of the auxiliary layer 140 is sharp, it may separate the edge of the separated portion of the first transfer layer 230 from a middle portion of the separated portion of the first transfer layer 230. That is, the edge of the separated portion of the first transfer layer 230 may remain on the edge of the auxiliary layer 140 to become an edge portion (150b, 160b, 170b) of an organic layer (150, 160, 170), and the middle portion of the separated portion of the first transfer layer 230 may land on the first electrode 120 to become a middle portion (150a, 160a, 170a) of the organic layer (150, 160, 170).

Referring to FIG. 9, after the formation of the first organic layer 150, the second donor substrate 300 may be placed over the element substrate 190. The second donor substrate 300 may include a second base layer 310, a second light-to-heat conversion layer 320, and a second transfer layer 330. Although not shown in the drawing, the second donor substrate 300 may further include a second intermediate layer and a second buffer layer.

The second donor substrate 300 may have a similar structure to that of the first donor substrate 200. That is, the second base layer 310, the second light-to-heat conversion layer 320, the second intermediate layer, and the second buffer layer may be substantially the same as the first base layer 210, the first light-to-heat conversion layer 220, the first intermediate layer, and the first buffer layer, respectively. In addition, the second transfer layer 330 may be formed of substantially the same material as the second organic layer 160 described above and may have substantially the same stacked structure as the second organic layer 160 described above.

Referring to FIG. 10, after the second donor substrate 300 is placed over the element substrate 190, the second organic layer 160 may be formed by irradiating laser beams 500 to the second donor substrate 300. The operation of FIG. 10 is substantially the same as the operation of FIG. 8, and thus a detailed description thereof will be omitted.

Referring to FIG. 11, after the formation of the second organic layer 160, the third donor substrate 400 may be placed over the element substrate 190. The third donor substrate 400 may include a third base layer 410, a third light-to-heat conversion layer 420, and a third transfer layer 430. Although not shown in the drawing, the third donor substrate 400 may further include a third intermediate layer and a third buffer layer.

The third donor substrate 400 may have a similar structure to that of the first donor substrate 200. That is, the third base layer 410, the third light-to-heat conversion layer 420, the third intermediate layer, and the third buffer layer may be substantially the same as the first base layer 210, the first light-to-heat conversion layer 220, the first intermediate layer, and the first buffer layer, respectively. In addition, the third transfer layer 430 may be formed of substantially the same material as the third organic layer 170 described above and may have substantially the same stacked structure as the third organic layer 170 described above.

Referring to FIG. 12, after the third donor substrate 400 is placed over the element substrate 190, the third organic layer 170 may be formed by irradiating laser beams 500 to the third donor substrate 400. The operation of FIG. 12 is substantially the same as the operation of FIG. 8, and thus a detailed description thereof will be omitted.

Referring to FIG. 13, after the formation of the first organic layer 150, the second organic layer 160, and the third organic layer 170, the second electrode 180 may be formed on the first organic layer 150, the second organic layer 160, and the third organic layer 170. The second electrode 180 may be formed by a deposition or sputtering process.

Figure 14:
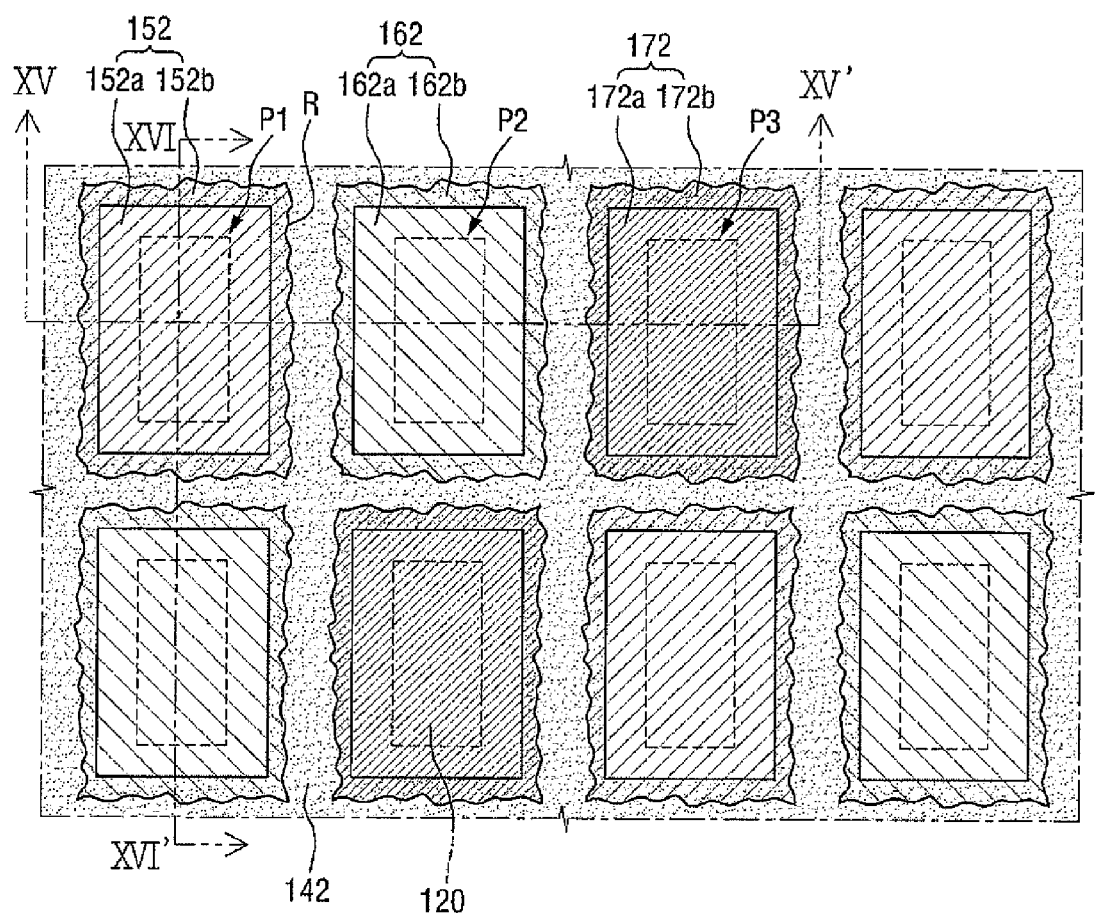
FIG. 14 is a schematic plan view of an organic luminescence display according to another embodiment of the present invention.
Figure 15:
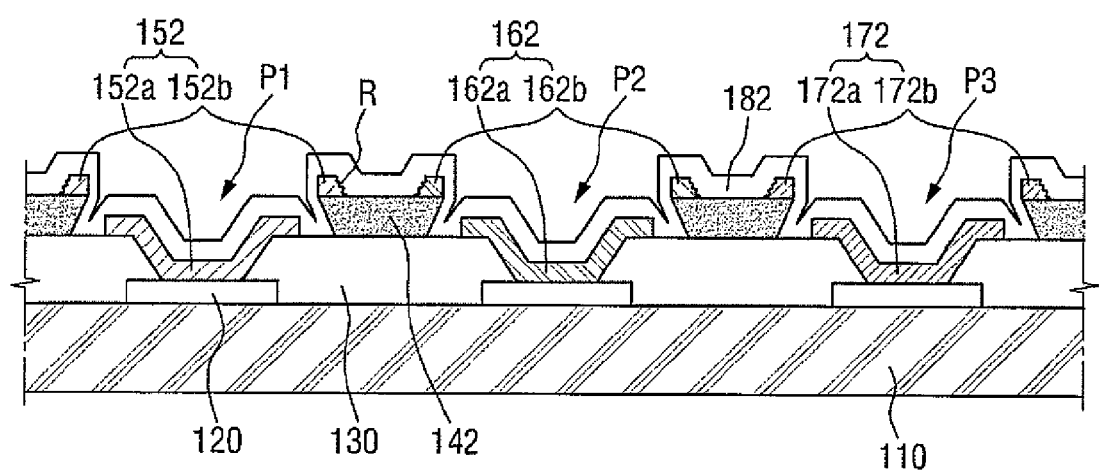
FIG. 15 is a cross-sectional view taken along the line XV-XV' of FIG. 14.
Figure 16:
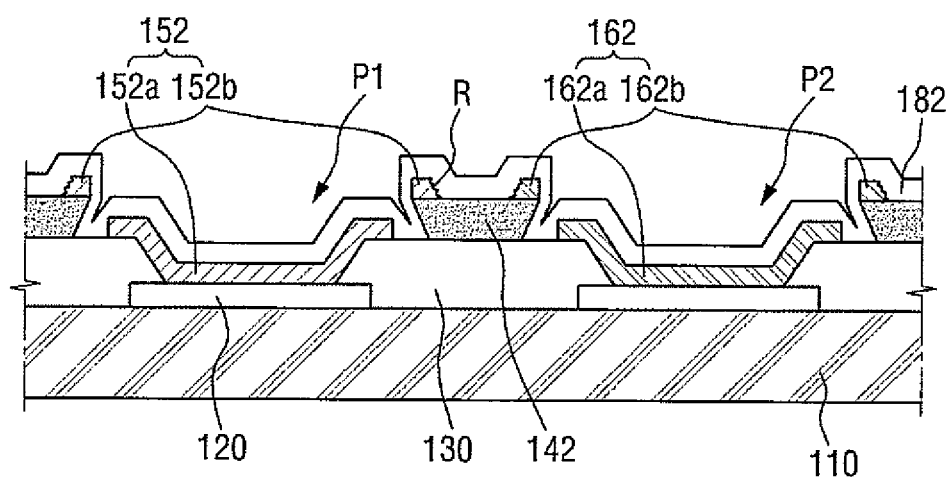
FIG. 16 is a cross-sectional view taken along the line XVI-XVI' of FIG. 14.

FIG. 14 is a schematic plan view of an organic luminescence display 102 according to another embodiment of the present invention. FIG. 15 is a cross-sectional view taken along the line XV-XV' of FIG. 14. FIG. 16 is a cross-sectional view taken along the line XVI-XVI' of FIG. 14. For simplicity, elements substantially identical to those of FIGS. 1 through 4 are indicated by like reference numerals, and thus a redundant description thereof will be omitted.

Referring to FIGS. 14 through 16, in the organic luminescence display 102 according to the current embodiment, each of a plurality of pixels (P1, P2, P3) may be surrounded by different pixels. For example, each of the first pixels P1 may be surrounded by the second and the third pixels P2 and P3, each of the second pixels P2 may be surrounded by the first and the third pixels P3, and each of the third pixels P3 may be surrounded by the first and the second pixels P1 and P2. In addition, an auxiliary layer 142 may surround each of the pixels (P1, P2, P3). That is, the auxiliary layer 142 may be formed in a lattice pattern when seen in a plan view. Therefore, an edge portion (152b, 162b, 172b) of an organic layer (152, 162, 172) may be disposed on an edge of the auxiliary layer 142, and a middle portion (152a, 162a, 172a) of the organic layer (152, 162, 172) may be disposed on a corresponding first electrode 120. In addition, as the shapes of the auxiliary layer 142 and the organic layer (152, 162, 172) change, the shape of a second electrode 182 may also change accordingly.

Embodiments of the present invention provide at least one of the following features:

First, an edge portion of an organic layer which includes a random uneven surface is separated from each of a plurality of pixels and placed on an edge of an auxiliary layer, thereby improving the flatness of the organic layer included in each of the pixels. The improved flatness of the organic layer included in each of the pixels can enhance display quality of each of the pixels.

In addition, because the improved flatness of the organic layer enhances the flatness of a thin-film encapsulation layer formed on the pixels, it is possible to reduce or prevent the occurrence of defects, such as developing dark spots, in the pixels.

Furthermore, if the auxiliary layer is formed of a conductor, it can serve as an auxiliary electrode and thus reduce power consumption of an organic luminescence display.

However, the effects of the present invention are not restricted to the ones set forth herein. The above and other effects of the present invention will become more apparent to one of daily skill in the art to which the present invention pertains by referencing the claims and equivalents thereof.

While the present invention has been particularly shown and described with reference to example embodiments thereof, it will be understood by those of ordinary skill in the art that various changes in form and details may be made therein without departing from the spirit and scope of the present invention as defined by the following claims, and equivalents thereof. It is therefore desired that the present embodiments be considered in all respects as illustrative and not restrictive, reference being made to the appended claims, and equivalents thereof, rather than the foregoing description to indicate the scope of the invention.

What is claimed is:

1. An organic luminescence display comprising:
   a substrate;
   a first electrode on the substrate;
   a pixel defining layer on the first electrode and partially exposing the first electrode;
   an auxiliary layer on the pixel defining layer;
   an organic layer comprising a middle portion on the first electrode and an edge portion on an edge of the auxiliary layer, a surface of the edge portion of the organic layer defining a center portion of a top surface of the auxiliary layer exposed by the organic layer; and
   a second electrode on the organic layer, wherein
   the surface of the edge portion of the organic layer has a surface roughness higher than other surfaces of the edge portion of the organic layer.

2. The organic luminescence display of claim 1, wherein the middle portion and the edge portion comprise the same material.

3. The organic luminescence display of claim 1, wherein the edge portion comprises a random uneven surface.

4. The organic luminescence display of claim 1, wherein the middle portion and the edge portion are separated from each other.

5. The organic luminescence display of claim 1, wherein the auxiliary layer has an inversely tapered shape.

6. The organic luminescence display of claim 1, wherein an angle formed by a side surface of the auxiliary layer and a top surface of the pixel defining layer is 90 to 180 degrees.

7. An organic luminescence display comprising:
   a plurality of pixels, each comprising a first electrode, a second electrode on the first electrode, and a middle portion of an organic layer between the first electrode and the second electrode; and
   at least one auxiliary layer between the pixels and having an edge portion of the organic layer on a top surface thereof, a surface of the edge portion of the organic layer defining a center portion of the top surface of the auxiliary layer exposed by the organic layer, wherein
   the surface of the edge portion of the organic layer has a surface roughness higher than other surfaces of the edge portion of the organic layer.

8. The organic luminescence display of claim 7, wherein the pixels are arranged in a matrix pattern, and the auxiliary layer is parallel to rows or columns of the pixels.

9. The organic luminescence display of claim 8, wherein the auxiliary layer surrounds each of the pixels.

10. The organic luminescence display of claim 7, wherein the edge portion of the organic layer is on an edge of the auxiliary layer.

11. The organic luminescence display of claim 10, wherein the middle portion and the edge portion comprise the same material.

12. The organic luminescence display of claim 10, wherein the edge portion comprises a random uneven surface.

13. The organic luminescence display of claim 10, wherein the middle portion and the edge portion are separated from each other.

14. The organic luminescence display of claim 7, wherein the auxiliary layer has an inversely tapered shape.

* * * * *